US006462339B1

(12) United States Patent
Michaluk et al.

(10) Patent No.: US 6,462,339 B1
(45) Date of Patent: Oct. 8, 2002

(54) METHOD FOR QUANTIFYING THE TEXTURE HOMOGENEITY OF A POLYCRYSTALLINE MATERIAL

(75) Inventors: Christopher A. Michaluk, Gilbertsville, PA (US); David P. Field, Pullman, WA (US)

(73) Assignee: Cabot Corporation, Boston, MA (US)

( * ) Notice: Subject to any disclaimer, the term of this patent is extended or adjusted under 35 U.S.C. 154(b) by 0 days.

(21) Appl. No.: 09/665,845

(22) Filed: Sep. 20, 2000

(51) Int. Cl.$^7$ ........................ G01N 23/203; H01J 37/26

(52) U.S. Cl. ........................ 250/310; 250/307; 250/311

(58) Field of Search ................................ 250/307, 310, 250/311

(56) References Cited

U.S. PATENT DOCUMENTS 5,576,543 A * 11/1996 Dingley ....................... 250/311

OTHER PUBLICATIONS

Michaluk et al. "Affect of Localized Texture on the Sputter Performance of Tantalum," *Twelfth International Conference on Textures of Materials*, vol. 2, pp. 1357–1367 ( No date provided).

Szpunar, "Texture Design for new Applications", *Twelfth International Conference on Textures of Materials*, pp. 6–8 (No date provided).

Adams et al., "Orientation Imaging Microscopy: New Possibilities for Microstructural Investigations Using Automated BKD Analysis," *Materials Science Forum*, vol. 157–162 (1994), pp. 31–42.

Matthies et al., On Some Methodical Developments Concerning Calculations Performed Directly in the Orientation Space, *Materials Science Forum*, vol. 157–162, (1994), pp. 1641–1646.

Wright et al., "Textural and Microstructural Gradient Effects on the Mechanical Behavior of Tantalum Plate," *Metallurgical and Materials Transactions*, vol. 25A, (May 1994), pp. 1025–1031.

Bunge, "Industrial Applications of Texture Analysis," pp. 241–278 (no date provided).

Bunge, "Representation and Interpretation of Orientation Distribution Functions," pp. 19–48 (no date provided).

Bunge, "Introduction to Quantitative Texture Analysis," DGM Informationsgesellschaft, Oberursel ($2_{nd}$ Ed.) (1986), pp. 3–19.

TSL Technical Note, Advanced Materials Analysis Via Orientation Imaging Microscopy™ (OIM™), pp. 1–11, (no date provided).

Bunge, "Texture Analysis in Materials Science," Orientation of Individual Crystallites, pp. 1–118, (no date provided).

* cited by examiner

Primary Examiner—Bruce Anderson
Assistant Examiner—Zia R. Hashmi

(57) ABSTRACT

A method for quantifying the texture homogeneity of a polycrystalline material is described. The method involves selecting a reference pole orientation; scanning in increments a cross-section of the polycrystalline material having a thickness with scanning orientation imaging microscopy or other measuring technique to obtain actual pole orientations of a multiplicity of grains throughout the cross-section of the polycrystalline material. The orientation differences between the reference pole orientation and actual pole orientations of a multiplicity of grains is then determined. A value of misorientation from the reference pole orientation at each grain measured throughout the thickness is then assigned. The average misorientation of each measured increment throughout the thickness is then determined. A texture gradient and/or texture banding can then be obtained by determining the first and/or second derivative, respectively, of the average misorientation of each measured increment through the thickness of the sample used for evaluation. A method to predict the sputtering efficiency of a target is also described as well as a system for quantifying the texture homogeneity of a polycrystalline material.

27 Claims, 17 Drawing Sheets

(6 of 17 Drawing Sheet(s) Filed in Color)

Relative orientation of sample with respect to bulk material (a) and definition of variables δ and h (b)

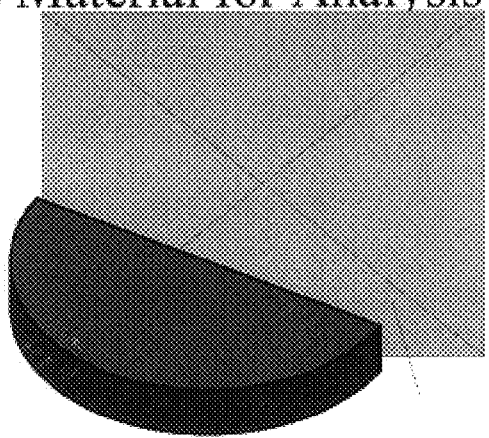
Figure 1: Relative orientation of sample with respect to bulk material (a) and definition of variables δ and h (b)

Microstructurally Banded Ta Plate

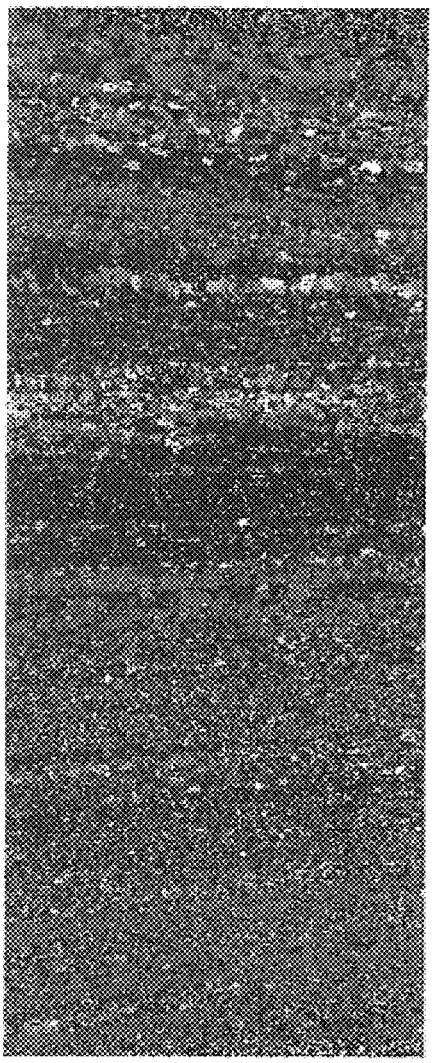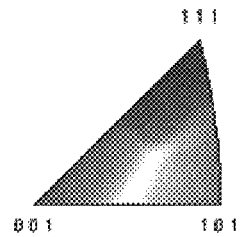
Orientation color coded map -- Sample Ta target
Figure 8

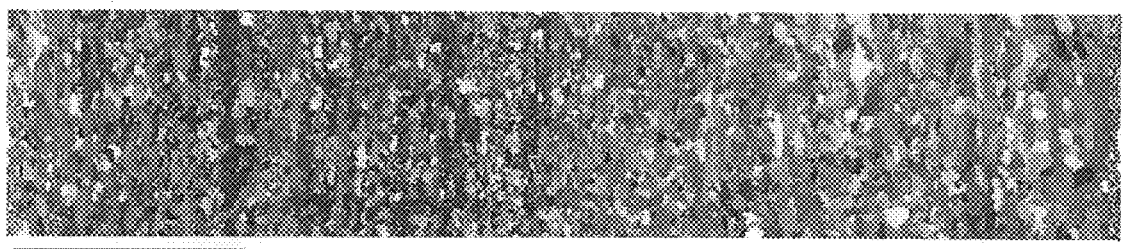
2000.0 µm = 100 steps   IPF [010]
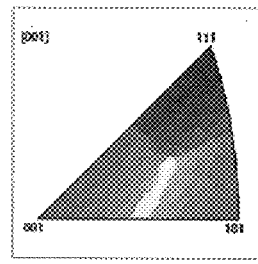
Figure 15

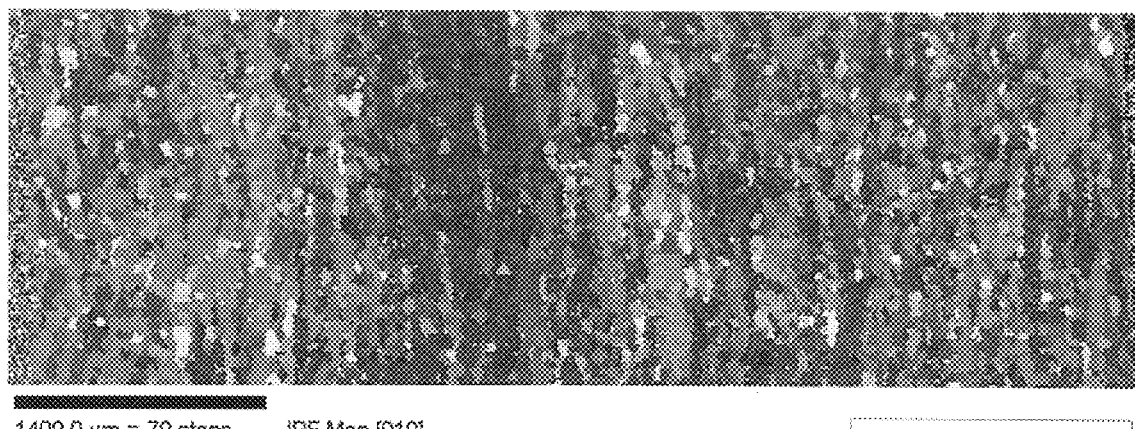
1400.0 µm = 70 steps    IPF Map [010]
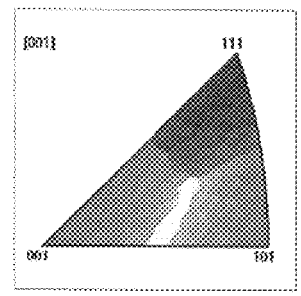
FIGURE 16
Level Rolled Ta Plate

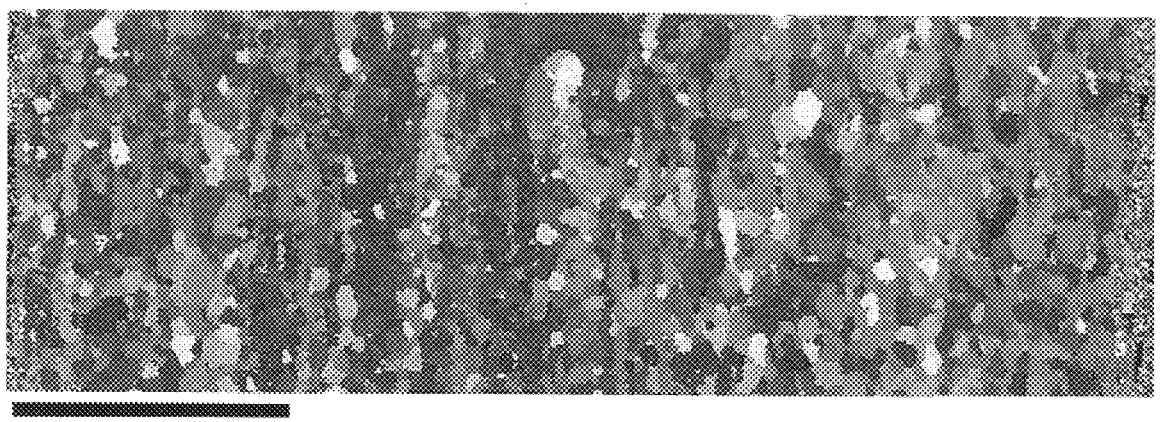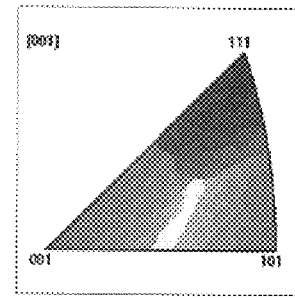
FIGURE 17
Not Level Rolled Ta Plate

METHOD FOR QUANTIFYING THE TEXTURE HOMOGENEITY OF A POLYCRYSTALLINE MATERIAL

BACKGROUND OF THE INVENTION

The present invention relates to the texture of polycrystalline materials and further relates to methods of determining or quantifying the texture homogeneity of polycrystalline materials. The present invention further relates to sputtering targets and determining sputtering efficiencies in sputtering targets.

Certain properties of polycrystalline materials, including deformation behavior, magnetic permeability, corrosion rate, and resistance to electromigration are generally dependent on the arrangement of atoms within the material (J. A. Szpunar, Texture Design for New Application, *Proceeding of the Twelfth International Conference on Textures of Materials*, J. A. Szpunar (ed.), NRC Research Press, Ottawa, pp. 6, 1999), incorporated in its entirety herein by reference. Often, the processes utilized to manufacture wrought metals and alloys impart a preferred orientation to the individual crystallites in the material. Crystallographic texture refers to the alignment of atomic planes within a material, and the Orientation Distribution Function (ODF) provides a mathematical description of the arrangement of all crystallites with respect to a specific coordinate system, such as the rolling direction, transverse direction, and normal direction of a rolled plate (H. J. Bunge, Introduction to Quantitative Texture *Analysis, Advance and Applications of Quantitative Texture Analysis*, H. J. Bunge and C. Esling (eds.) DGM Informationsgesellschaft mbH, Oberursel, Germany, pp. 3–18, 1991; H. J. Bunge, Representation and Interpretation of Orientation Distribution Functions, *Advances and Application of Quantitative Texture Analysis*, H. J. Bunge and C. Esling (eds.) DGM Informationsgesellschaft mbH, Oberursel, Germany, pp. 19–48, 1991), both incorporated in their entirety herein by reference.

Conventionally, diffraction techniques are used for determining the preferred orientation of materials. These methods generate pole figures, a 2-dimensional representation of the distribution of a normal (i.e. pole) of a specific atomic plane about the measurement surface of the sample. A 3-dimensional description of the texture can then be calculated by mathematical inversion of several different pole figures (H.-J. Bunge, Texture Analysis in Materials Science, Cuvillier Verlag, Göttingen, Germany, pp. 2–118, 1993), incorporated in its entirety herein by reference. X-ray and neutron diffraction are considered integrative measurement techniques. These methods require that a relatively large area of the sample be irradiated in order to collect bulk diffraction information for a statistically significant number of grains.

While conventional diffraction techniques can be used to adequately determine the bulk texture of materials, they are incapable of identifying the presence of texture inhomogeneities within the sample. The existence of discontinuous textures has been shown to significantly influence the performance of engineering materials. For example, secondary recrystallization and growth of (011) grains enhance the magnetic permeability of SiFe (H. J. Bunge, Industrial Applications of Texture Analysis, *Advances and Application of Quantitative Texture Analysis*, H. J. Bunge and C. Esling (eds.) DGM Informationsgesellschaft mbH, Oberursel, Germany, pp. 241–278, 1991), incorporated in its entirety herein by reference, and sharp bands of localized textures impact the deformation and sputtering performance of tantalum (S. I. Wright, G. T. Gray, and A. D. Rollett, Textural and Microstructural Gradient Effects on the Mechanical Behavior of a Tantalum Plate, *Metallurgical and Material, Transactions A*, 25A, pp.1025–1031, 1994; C. A. Michaluk, D. B. Smathers, and D. P. Field, Affect of Localized Texture on the Sputtering Performance of Tantalum, *Proceedings of the Twelfth International Conference on Textures of Materials*, J. A. Szpunar (ed.), NRC Research Press, Ottawa, pp. 1357–1362, 1999), all incorporated in their entirety herein by reference. An efficient and reliable means of revealing texture homogeneity is to use Orientation Imaging Microscopy (OIM). With OIM, the orientation of each individual crystallite can be determined by probing with an electron beam and then indexing the resultant Kikuchi pattern (B. L. Adams, D. L. Dingley, K. Kunze, and S. I. Wright, Orientation Imaging Microscopy: New Possibilities for Microstructural Investigations Using Automated BKD Analysis, *Materials Science Forum*, Vol. 157–162, pp.31–42, 1994; Advanced Materials Analysis Via Orientation Imaging Microscopy (OIM), *TSL Technical Note*, Tex-SEM Laboratories, Draper, UT), both incorporated in their entirety herein by reference. The global texture can then be roughly determined from discrete orientation data (S. Matthies and G. W. Vinel, On Some Methodical Developments Concerning Calculations Performed Directly in the Orientation Space, *Materials Science Forum*, Vol. 157–162, pp.1641–1646, 1994), incorporated in its entirety herein by reference.

Using OIM, the textural uniformity can be displayed in the form of an Inverse Pole Figure (IPF) map, which is a micrograph where each discrete grain is color-coded with respect to this crystal orientation. Textural gradients and bands are represented as respective color gradations and striations in the IPF map. However, visual interpretation of an IPF provides a very subjective description of the texture character of the samples. While a visual representation of the texture of polycrystalline materials is helpful in revealing any texture inhomogeneity in polycrystalline materials, an interpretation must be made and interpretations may significantly vary from person to person. Also, visual representations of texture can only provide a general idea as to texture homogeneity. Accordingly, there is a need in the analytical and industrial areas to somehow quantify texture homogeneity that exists in polycrystalline materials. Quantifying texture homogeneity will provide an objective determination and avoid varying subjective determinations. Thus, a standard unit can be created with respect to texture homogeneity that could be used by the analytical and industrial community in understanding the texture homogeneity existing in polycrystalline material. This would have commercial benefits, such as predicting the sputtering efficiency of targets as well as setting industry standards for the manufacturing of polycrystalline materials where texture homogeneity is one of the criteria of an acceptable product.

SUMMARY OF THE PRESENT INVENTION

A feature of the present invention is to provide a method for quantifying texture homogeneity in polycrystalline material.

Another feature of the present invention is to provide methods to predict the sputtering reliability of sputtering targets.

A further feature of the present invention is to provide a method to create an objective determination of texture homogeneity for use as an industry standard.

An additional feature of the present invention is to provide a system to quantify texture homogeneity in polycrystalline material.

Additional features and advantages of the present invention will be set forth in part in the description that follows, and in part will be apparent from the description, or may be learned by practice of the present invention. The objectives and other advantages of the present invention will be realized and attained by means of the elements and combinations particularly pointed out in the description and appended claims.

To achieve these and other advantages, and in accordance with the purposes of the present invention, as embodied and broadly described herein, the present invention relates to a method for quantifying the texture homogeneity of a polycrystalline material. The method involves selecting a reference pole orientation. Further, in this method, a cross-section of the polycrystalline material which has a certain thickness is scanned in increments through the thickness using scanning orientation imaging microscopy (OIM) to obtain crystal orientations of a multiplicity of grains that exist in the incremental thickness of the cross-section of the material. Methods other than OIM can be used to obtain the crystal orientations. The orientation differences between the reference pole orientation and the actual crystal orientation obtained for each grain through scanning can then be determined. A value of misorientation from the reference pole orientation at each grain measured throughout the thickness can then be assigned and then an average misorientation of each measured increment throughout the thickness of the cross-section of the material can be determined. Once determined, the severity of texture banding can be determined by taking a second derivative of the average misorientation of each measured increment through the thickness of the cross-section of the material. This second derivative represents the texture banding and provides a quantitative number as to the texture homogeneity of the polycrystalline material that has been tested. A number that is closer to zero represents a material that has good texture homogeneity (e.g., a material having very few inflection points with respect to the severity of banding).

The present invention also relates to a method to predict the sputtering reliability of a target that involves quantifying the texture homogeneity of the target by taking a cross-section of the target for sampling purposes and obtaining the texture banding of the sample. The texture measurement then provides a predictive value as to the sputtering efficiency of a target and a number close to zero represents a target that has consistent sputtering efficiency.

The present invention also relates to a system for quantifying the texture homogeneity of a polycrystalline material which includes a scanning orientation imaging microscope or other device that measures crystal orientations, such as x-ray micro-diffraction, and means to determine the average misorientation of each measured increment throughout the thickness of the material being tested and means to determine a texture homogeneity by taking the second derivative of the average misorientation of each measured increment through the thickness of the material being tested.

It is to be understood that both the foregoing general description and the following detailed description are exemplary and explanatory only and are intended to provide a further explanation of the present invention, as claimed.

The accompanying drawings, which are incorporated in and constitute a part of this application, illustrate several embodiments of the present invention and together with the description, serve to explain the principles of the present invention.

All patents and publications mentioned above and throughout the present application are incorporated herein in their entirety and form a part of the present application.

BRIEF DESCRIPTION OF THE DRAWINGS

The file of this patent contains at least one drawing executed in color. Copies of this patent with color drawings(s) will be provided by the Patent and Trademark Office upon request and payment of the necessary fee.

FIG. 8 is the orientation map revealing textural bands through the transverse section of the tantalum sputtering target shown in FIG. 7.

FIG. 12 shows a photograph of a spent tantalum sputtering target deemed to have desirable sputtering performance.

FIG. 15 shows the orientation map of a sample taken from the periphery of the sputtering target shown in FIG. 13.

FIG. 16 shows the orientation map of a transverse sample of tantalum plate that had been cold rolled to gauge, level rolled flat, and then recrystallized.

FIG. 17 shows the orientation map of a transverse sample of tantalum plate taken from the same production lot as the sample shown in FIG. 16, that had been cold rolled to gauge, and then recrystallized without level rolling.

DETAIL DESCRIPTION OF THE PRESENT INVENTION

Figure 2:
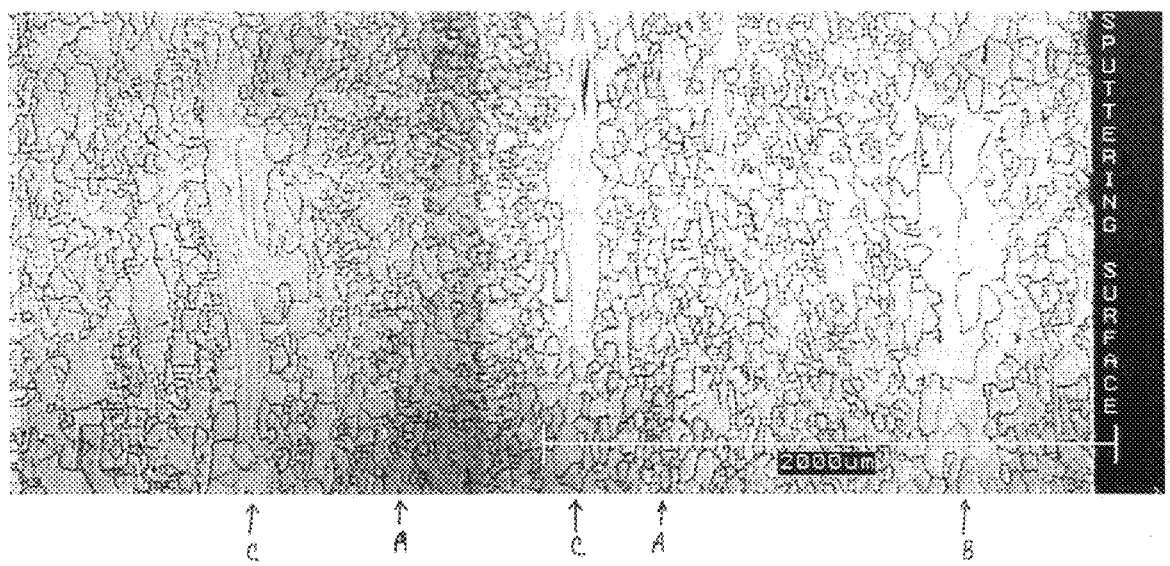
FIG. 2 is the microstructure across a transverse section of cold rolled and annealed tantalum plate containing regions having either fine or coarse grain size along with bands of elongated grains.

The present invention relates to a method and system for quantifying the texture homogeneity of polycrystalline materials. The polycrystalline material can be any material having polycrystalline characteristics. Preferably, the polycrystalline material is a metal or a ceramic. Metal-containing materials that have polycrystalline characteristics can also be used in the present invention such as alloys and the like. Preferably, the polycrystalline material is a valve metal such as tantalum, niobium, or alloys thereof.

In the present invention, a polycrystalline material can be tested to quantify the texture homogeneity of the polycrystalline material. A sample of the polycrystalline material can be used to make such a determination and preferably the sample is a cross-section of the polycrystalline material representing the thickness of the polycrystalline material. In the method of the present invention, a reference pole orientation is selected. This reference pole orientation can be any arbitrarily assigned orientation. This number is simply used as a reference point to compare with actual orientation readings taken. Preferably, the reference pole orientation used will correlate with the sample coordinate system; for example, a (001) pole is used when analyzing transverse sections of cubic metals since the reference orientation correlates directly with the orthogonal sample coordinate system of normal, transverse, and reference directions.

The sample of the polycrystalline material can be any size capable of being scanned by orientation imaging microscopy or other measuring technique and is preferably a sample representing the entire thickness of the polycrystalline material and having a width of about 1¼" or less. Generally, the size of the sample width will generally be restricted to the size of the surface area that the scanning orientation imaging microscope or other device can scan. The sample, in the method of the present invention, is preferably scanned with a scanning orientation imaging microscope to obtain actual pole orientations of a multiplicity of grains. The actual pole orientations are preferably obtained across the width of the sample and throughout the thickness of the sample in pre-determined increments. Thus, a two-dimensional type scan is achieved in the preferred operation of the present invention, namely, a scanning across the sample and throughout the entire thickness of the sample. The number of grains that are scanned to obtain actual pole orientations can be based on the amount of data points desired and eventually used to determine the texture gradient of the material. Every grain in the width of the sample can be scanned or a pole orientation can be obtained based on a pre-determined spacing. In other words, for instance, every $100_{th}$ grain can be measured or any other type of desired spacing. Similarly, the increment of thickness which are measured can be any spacing equal to or greater than the nominal grain size of the polycrystalline material. The scanning orientation imaging microscope has settings to determine such spacing across the sample and/or through the increments of thickness. Increment spacing can be selected if the nominal grain size of the sample has been predetermined by other means, such as optical microscopy. The scanning orientation imaging microscope can be a stage-controlled scanning orientation imaging microscope or a beam controlled scanning orientation imaging microscope. Also, for purposes of the present invention, any other device capable of obtaining actual pole orientations can be used as a substitute for scanning orientation microscopy, such as, but not limited to, x-ray microdiffraction and the methods and devices described in Wright, A Review of Automated Orientation Imaging Microscopy (OIM), *J. Computer Assisted Microscopy*, pp. 207–221, Vol. 5, No. 3, 1993, incorporated in its entirety by reference. Preferably, the scanning orientation imaging microscope is a commercially available SEM equipped with a low-light camera with a phosphor screen to capture the Kikuchi patterns generated when individual grains are irradiated by the SEM electron beam, and a means of indexing each Kikuchi pattern to determine the orientation of each grain.

Once the sample of the polycrystalline material is scanned as described above, the orientation differences between the reference pole orientation and the actual pole orientations measured for the multiplicity of grains are determined. This orientation difference can be determined by mathematical calculations or a program can be set up to determine the orientation differences. Once the orientation differences are determined, a value to reflect the average amount of misorientation from the reference pole orientation for each position measured throughout the thickness of the sample is determined. Again, this determination can be made by a mathematical calculation or a program that will do the calculations. Misorientation values are assigned based on the amount of rotation necessary to align the pole of the measured grain with the reference pole of the sample. Values are reported in degrees.

For each increment there generally is two or more misorientation values which are averaged together to determine an average misorientation for each measured increment throughout the thickness of the sample being tested. Once this average misorientation is determined, the severity of the texture gradient and textured bands can be obtained by determining the first and second derivatives respectively of the average misorientation of each measured increment through the thickness of the material being tested. Again, the average misorientation and the derivatives can be calculated by mathematical formulas or can be determined by a program that provides the calculations. The texture gradient and banding numbers obtained by taking the first and second derivative of the average misorientation of each measured increment throughout the thickness of a polycrystalline material represent numbers which quantify the texture homogeneity of a polycrystalline material. Each number is preferably zero, which would indicate a texture homogeneity that is nearly perfect. A texture gradient which is close to zero is generally preferred since it represents excellent texture homogeneity. Numbers considerably away from zero represent materials that have a poor texture homogeneity. Second derivative values well above zero are highly undesirable in sputtering targets (e.g., value metal sputtering targets) because the existence of sharp texture bands hinder sputtering performance (C. A. Michaluk, D. B. Smathers, and D. P. Field, Affect of Localized Texture on the Sputtering Performance of Tantalum, *Proceedings of the Twelfth International Conference on Texture of Material*, J. A. Szpunar (ed.), NRC Research Press, Ottawa, pp. 1357–1362, 1999), incorporated in its entirety herein by reference.

In the present invention, the first derivative can optionally be taken of the average misorientation of each measured increment and this number reflects the overall change of pole orientation. While this first derivative may provide a true picture of the overall change in pole orientation, the first derivative may not yield an accurate description of the through-thickness texture gradient of the material. In more detail, polycrystalline material naturally has varying changes in texture. It is known for sputtering, for instance, that gradual changes in texture do not significantly affect the sputtering efficiency of a target. However, when there are significant changes in the texture from grain to grain or from various layers of thickness of the polycrystalline material, these significant changes are referred to as banding or inflection points. These bandings signify sharp dramatic changes in texture when compared to textures of grains around this point. Sharp banding leads to a poor sputtering performance of that area having sharp banding since sharp bandings provide a discontinuous change which is resistant to sputtering. When a particular area is resistant to sputtering, the material will generally not sputter in that vicinity. As a result, the target will have a poor sputtering efficiency. Accordingly, while gradual changes in texture generally do not affect the ability of a target to sputter effectively, dramatic changes in texture which are shown by banding are undesirable and lead to poor performance of the sputtering target. Thus, determining the texture homogeneity of polycrystalline material is important and being able to quantify the texture homogeneity of polycrystalline material permits the industry to predict the sputtering efficiency of a target. Other uses of quantifying the texture homogeneity of polycrystalline material include, but are not limited to, applications where the materials must undergo severe deformation and strain uniformity throughout the thickness of the part is critical.

Accordingly, the present invention further relates to a system for quantifying the texture homogeneity of a polycrystalline material and involves a system for obtaining the actual pole orientations of a multiplicity of grains, such as a scanning orientation imaging microscope (or other means) and means to select a reference pole orientation, means to determine orientation differences between the reference pole orientation and actual pole orientations of a multiplicity of grains in a polycrystalline material that have been obtained by scanning a cross-section of the polycrystalline material having a thickness, means for assigning a value of misorientation from the reference pole orientation at each grain measured throughout the thickness of the polycrystalline material being tested; means for determining the average misorientation of each measured increment throughout the thickness; and means for quantifying texture banding by taking the second derivative of the average misorientation of each measured increment through the thickness of the polycrystalline material being tested. Optionally, the system can also include means for determining the first derivative of the average misorientation of each measured increment throughout the thickness of the polycrystalline material being tested.

The misorientation angle between any two crystallographic poles is determined by taking the arc cosine of the dot product of two unit vectors that represent the pole orientations in an ortho-normal reference frame. When issues of crystal symmetry are considered, the maximum magnitude of the distance between two such poles is restricted. When dealing with materials having cubic crystal symmetry, the maximum physically indistinguishable misorientation angle between two poles is approximately 62.8 degrees.

In the examples, (001) was arbitrarily selected as a reference pole orientation, and the orientation differences between (001) and the actual measured pole orientation at each position throughout the samples was determined. The analysis region was sufficiently large so as to allow proper determination of crystallographic texture at any given plane through the thickness of the plate, and yet sufficiently small so that the pole orientation did not vary significantly. A single value of misorientation from the (001) pole at each point through the thickness of the plate is then assigned as the arithmetic average of all individual misorientation value about a common interval of the sample. These values are then plotted as a function, $f_1$, with distance through the increments of thickness ($\delta$) being the independent variable and misorientation from (001)($\omega$) being the dependent variable.

$$\omega = f_1(\delta)$$

The spatial gradient in the pole orientation at each point through the thickness is then determined by measuring the derivative of $\omega$ with respect to $\delta$. The overall change in pole orientation, $\Omega$, is obtained by integrating over the derivative function through the entire space, $$\Omega = \frac{1}{h}\int_0^h \frac{d\omega}{d\delta}d\delta$$

wherein h is the plate thickness. This value, while giving a true picture of the overall change in pole orientation, does not yield a unique or proper description of the through-thickness texture gradient. For example, a steadily changing pole orientation may yield the same result as one that rotates back and forth among various (hkl) values. To compensate for this deficiency, the number of severity of inflection points in the distribution is determined. These are obtained by calculating the second derivative of $f_1$.

$$\Lambda = \frac{1}{h}\int_0^h \frac{d^2\omega}{d^2\delta}d\delta$$

The two values, $\Omega$ and $\Lambda$, yielded a quantitative description of the severity of texture gradients through the plate.

As an example of the importance of quantifying texture homogeneity, as shown in the Examples, the present invention was used to quantify the texture homogeneity of three tantalum sputtering targets. One of the sputtering targets was known to have unacceptable sputtering performance, the second had undesirable sputtering performance, and the third was known to have excellent sputtering performance. The unacceptable and undesirable sputtering targets were thus expected to have a high texture gradient and sharp textural bands relative to each other and the other sputtering target having excellent sputtering performance. As can be seen in the Examples, the excellent sputtering target had homogeneity numbers that were significantly lower than the undesirable sputtering target, which itself had lower homogeneity values than the unacceptable sputtering target, thus showing the ability of the present invention to not only predict the sputtering efficiency of a target but also to quantify the texture homogeneity of a polycrystalline material which is helpful in setting industry standards. In other words, companies that use sputtering targets can now demand that certain sputtering targets have a particular texture gradient as part of their specifications in order to ensure that they obtain the desired sputtering efficiency of targets. Further, manufacturers of sputtering targets, for instance, can use the present invention as a quality control technique and as a research and development tool in ensuring that the targets that are made will provide acceptable sputtering efficiency. Other uses of the present invention include, but are not limited to, quantifying the integrity of tantalum for use in chemical energy (CE) munition warheads and other applications where uniformity of deformation is critical, such as deep-drawing of capacitor cops and crucibles.

The present invention will be further clarified by the following examples, which are intended to be purely exemplary of the present invention.

EXAMPLES

These experiments were concerned solely with the pole (plane normal) distribution function, but can easily be extended to cover the complete crystal orientation distribution function.

Example 1

This experiment was conducted to demonstrate the correlation between microstructural and textural inhomogeneities within a tantalum plate of poor metallurgical quality. Sputtering target-grade wrought and recrystallized 0.25" thick tantalum plate was obtained on the commercial market. Results of chemical, metallurgical, and mechanical properties are provided in Table 1. A sample approximately 0.25"×1.0"×0.5" was removed from a region approximately 0.5" or more away from any sheared edge of the plate. The sample was mounted, and the transverse face of the sample of the sample was ground, polished, and etched. The texture samples were prepared in accordance with the procedure described in C. A. Michaluk, C. Heubeck, and H. Klein, Methodologies for Determining the Global Texture of Tantalum Plate Using X-Ray Diffraction, Tantalum, (E.chem. et al., eds), TMS, Warrendale, Pa. (1996) pp 123–131, incorporated in its entirety herein by reference, with the exception that the as-polished samples were etched by swabbing with a reagent grade solution of 50% HF-50% $HNO_3$ for 35 seconds. A photomicrograph of the tantalum sample is provided in FIG. 2. As evident from FIG. 2, the poor quality tantalum plate exhibited an inhomogeneous microstructure comprised of a fine grain size (region A), a course grain size (region B), and local bands having a large and elongated grain structure (region C).

TABLE 1

| Annealed Plate | Description | Weight |
|---|---|---|
|  | ¼" × 13" × 13" | 53.1 lbs. |
| Chemical Analysis (in ppm) | O N C H Fe Ni Cr Cu Si Ti Mo W Nb Ta | |
|  | 5 11 6 <1 7 <5 <5 17 <8 <5 14 47 82 Bal. | |
| Tensile Strength UTS (KSI): | 34.6 | |
| Yield Strength .2% YD (KSI): | 19.4 | |
| % Elong: | 54 | |
| ASTM Grain Size: | 6.5 | |
| Hardness: | RB-30 | |
| Surface Finish: | 33 μin | |

A sample was then analyzed using a scanning electron microscope equipped with a low-light detector and a computerized data acquisition system capable of indexing the Kikuchi patterns generated from each individual grain in accordance to standard procedures as set forth in Electron Backscatter Diffraction (EBSD) procedures as presented in S. I. Wright, A Review of Automated Orientation Imaging, *Journal of Computer Assisted Microscopy*, Vol. 5, No. 3, pp 207–221, 1993, incorporated in its entirety herein by reference.

INITIAL SETUP

1) SEM: Set voltage to 20 kV, and about 5 nA of probe current
2) SEM: Set Scan Mode to TV
3) SEM: Go to low magnification (many grains in view).
4) SEM: Focus on scan area

COLLECT BACKGROUND IMAGE

5) OIM: Open Live Video
6) DSP: Set to Live mode (Live/Proc button)
7) DSP: Adjust Black Level and Gain so all LEDs are lit except for top and bottom
8) DSP: Set to Int mode (Int/Avg button)
9) DSP: Set Frames switch to 64
10) SEM: Make sure Scan Mode is still set to TV
11) DSP: Press B from the Load/Act column

COLLECT BACKGROUND CORRECTED IMAGES

12) SFM: Set Scan Mode to Spot
13) DSP: Set to Avg mode (Int/Avg button)
14) DSP: Press A/B button from Display column
15) DSP: Press A button from Load/Act column
16) DSP: Set Frames switch to 8

SET UP OIM

17) SEM: Set Scan Mode to External XY
18) OIM: Close Live Video window
19) OIM: Switch to phase page and load the correct phase
20) OIM: Switch to Calibration page
21) OIM: Capture a pattern
22) OIM: Calibrate pattern
23) OIM: Switch to Scan page.
24) OIM: Capture SEM image
25) OIM: Define and run scan.

Figure 3:
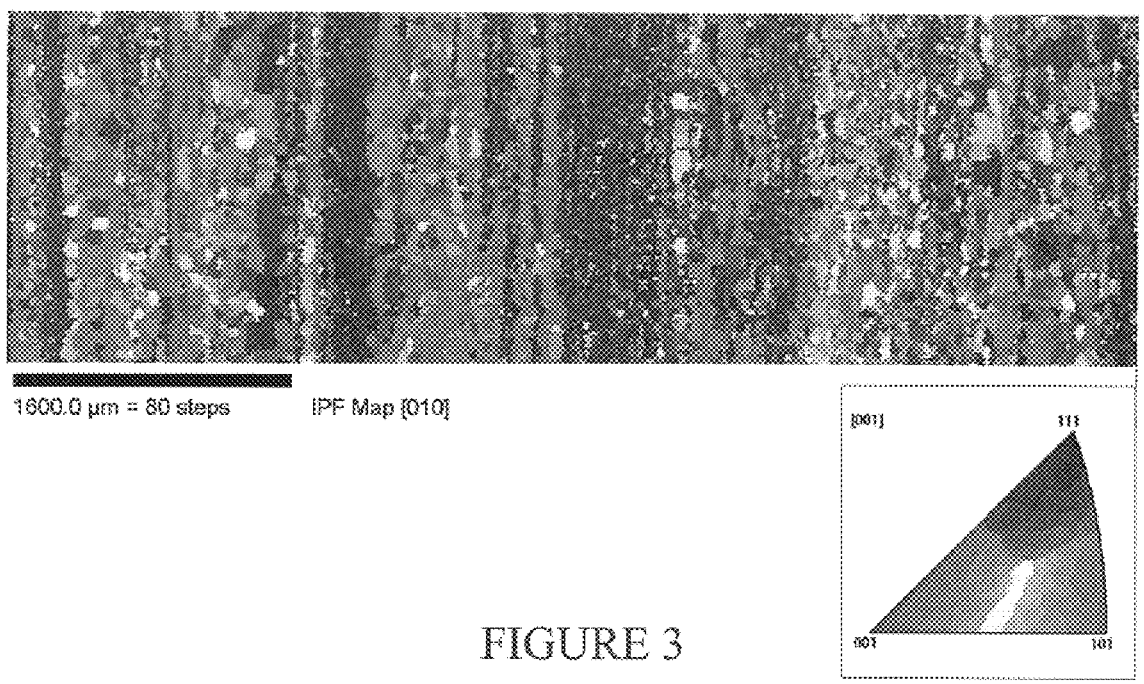
FIG. 3 is an orientation map of the same sample shown in FIG. 2 that was obtained using stage-controlled scanning orientation imaging microscopy.

The crystal orientation for each grain within an area of the sample, comprising the thickness of the plate (0.25") was calculated. The discrete orientations data, having been measured from the transverse plane of the original tantalum plate, was transposed (i.e. tilted) 90 degrees so inverse pole figure (IPF) orientation maps could be presented in reference to conventional sample-normal coordinates. The through thickness orientation map is shown in FIG. 3. Grains are color coded with respect to their planar orientation in compliance with the Standard Triangle color index also given in FIG. 3.

Visual examination of the orientation map in FIG. 3 readily reveals that the texture in not uniform along the thickness direction of the tantalum plate; generally, the texture ranges from a prominent (001) near the surface to a prominent (111) near the mid-plane of the plate. FIG. 3 also reveals that the plate also contains numerous bands (striations) of strong, localized texture. It becomes evident when comparing the microstructure from FIG. 2 with the orientation map of FIG. 3 that regions comprised of large and elongated grains correlate to bands of (001) texture.

Figure 4:
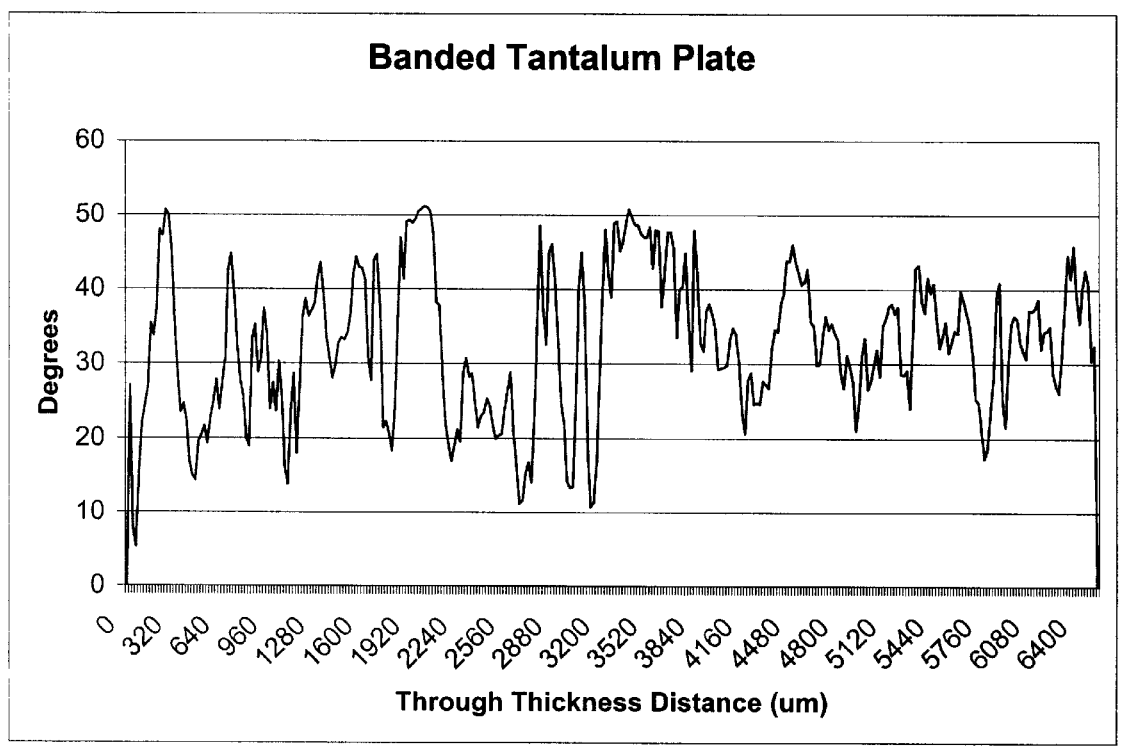
FIG. 4 is a chart providing the average misorientation of each increment versus the thickness of a polycrystalline material provided in FIG. 3.

The misorientation angle was determined for each discrete orientation by calculating the dot product of the crystal pole and (001) sample-normal pole vectors. Next, an average misorientation value ($\omega$) was determined for each thickness increment ($\delta$) from data points measured along a line parallel to the plate surface (i.e. the long edge of the sample). FIG. 4 shows the plot of average misorientation versus depth through the tantalum plate, and defines the relationship between incremental average orientation and depth through a plate $$\omega = f(\delta)$$

Figure 5:
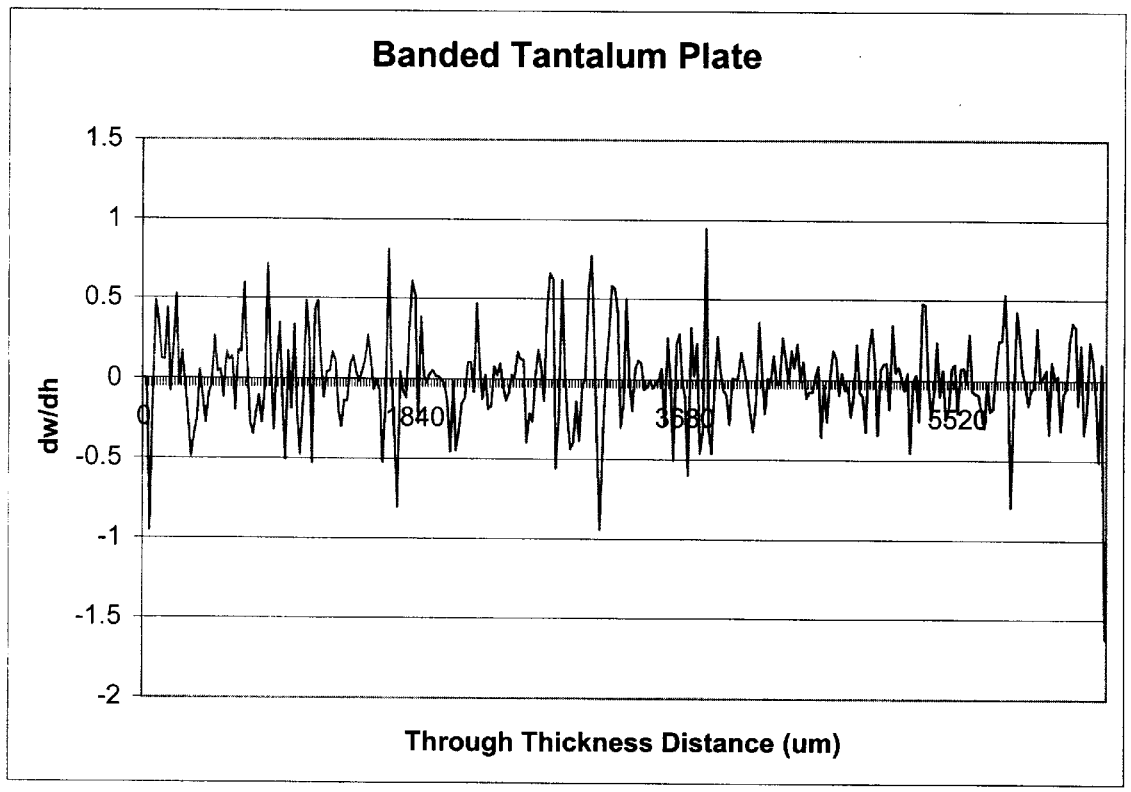
FIG. 5 provides the results of taking the first derivative of the average misorientation of each increment throughout the thickness of a polycrystalline material shown in FIG. 3.

The texture gradient is defined as the change in average planar orientation within an increment of plate thickness ($d\omega/d\delta$). FIG. 5 shows a plot of the rate of texture change through the thickness of the plate. The area under the plot given in FIG. 5 represents a measure of the extent of the texture gradient through the plate, and is calculated by integrating the derivative function through the thickness of the plate (h). Normalizing the integral by dividing by thickness (h) provides a scalar value representing the severity of the texture gradient in the sample:

$$\Omega = \frac{1}{h}\int_0^h \frac{d\omega}{d\delta}d\delta$$

In this example, the texture gradient parameter was found to be $\Omega$=265.

Figure 6:
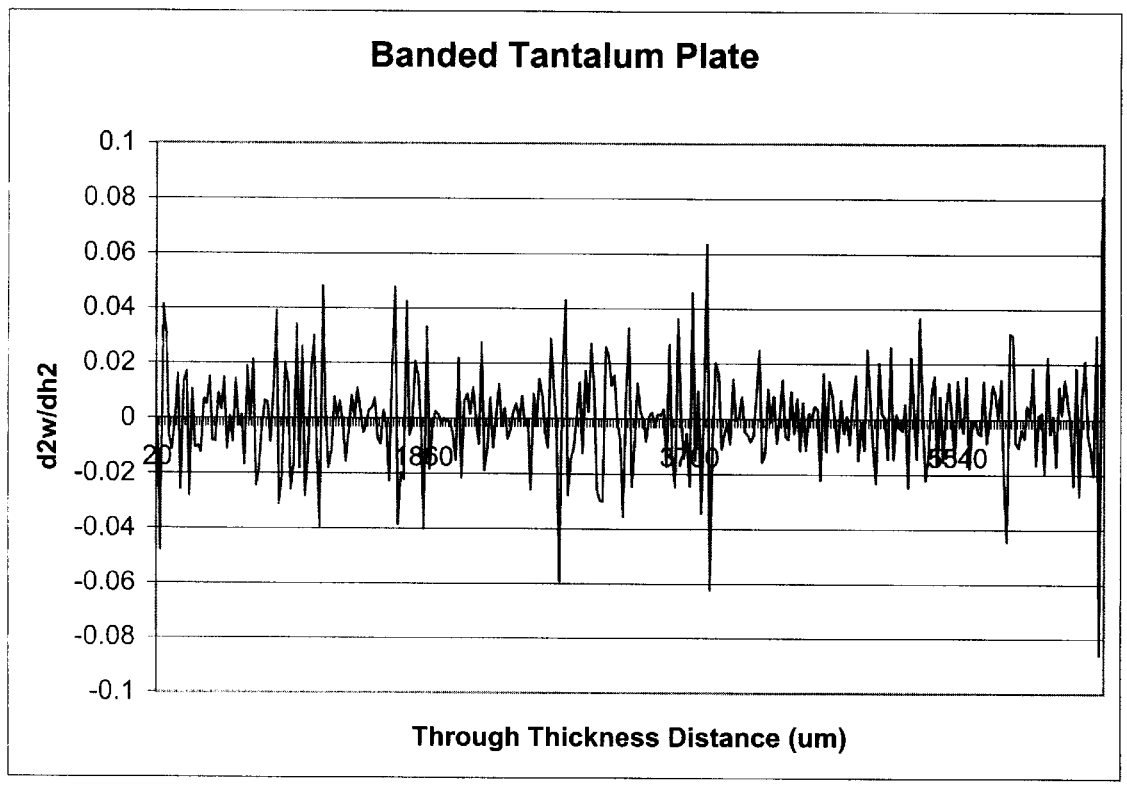
FIG. 6 is a chart of the second derivative function resulting from the average misorientation of each increment of the polycrystalline material shown in FIG. 3.

The texture gradient parameter $\Omega$ may not completely describe the texture homogeneity within the sample. Localized textural bands represent a discontinuity of the texture gradient, and are revealed as inflection points in the texture gradient function. FIG. 6 shows a plot of the second derivative of the texture function versus depth. Rapid transitions in texture gradient due to the presence of sharp, well-defined texture bands, are indicated by the relative maxima points in FIG. 6. The severity of the texture banding is expressed as the derivative of the texture gradient function:

$$\Lambda = \frac{1}{h}\int_0^h \frac{d^2\omega}{d^2\delta}d\delta$$

In this analysis, the value of the texture banding parameter is $\Lambda$=20.8.

Example 2

Figure 7:
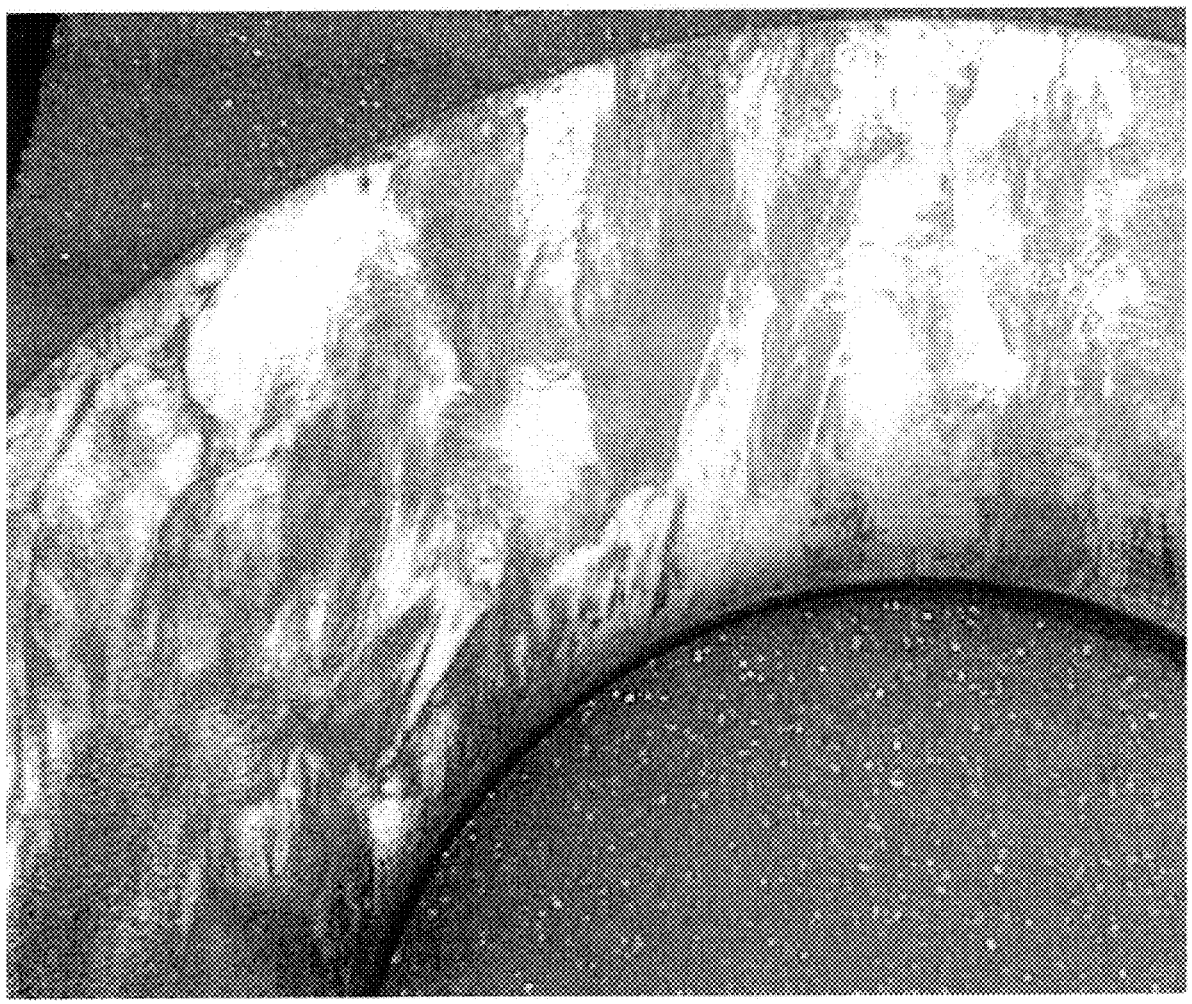
FIG. 7 is a photograph of a tantalum sputtering target that had been rejected for producing film having thickness uniformity of greater that +/−5%.

This analysis was conducted to determine values of $\Omega$ and $\Lambda$ for tantalum deemed unacceptable for use as a sputtering target. FIG. 7 shows a section of a tantalum sputtering target that the user rejected because it produced films with unacceptable variation in thickness (i.e. >5%). The eroded surface of the rejected target had large regions having a matte finish intermixed with areas having a lustrous finish. Texture analysis revealed that the matte surfaces contained a mixed (111)-(001) texture while the texture of lustrous regions was nearly entirely (001). It is been reported that the matte regions represent material that was readily eroded by sputtering, whereas the lustrous areas were resistant to sputter erosion, indicating that localized regions having a prominent (001) within a tantalum sputtering target are detrimental to sputtering performance (C. A. Michaluk, D. B. Smathers, and D. P. Field, Affect of Localized Texture on the Sputtering Performance of Tantalum, *Proceeding of the Twelfth Internationl Conference on Texture of Materials*, J. A. Szpunar (ed.), NRC Research Press, Ottawa, pp. 1357–1362, 1999), incorporated in its entirety herein by reference.

Figure 9:
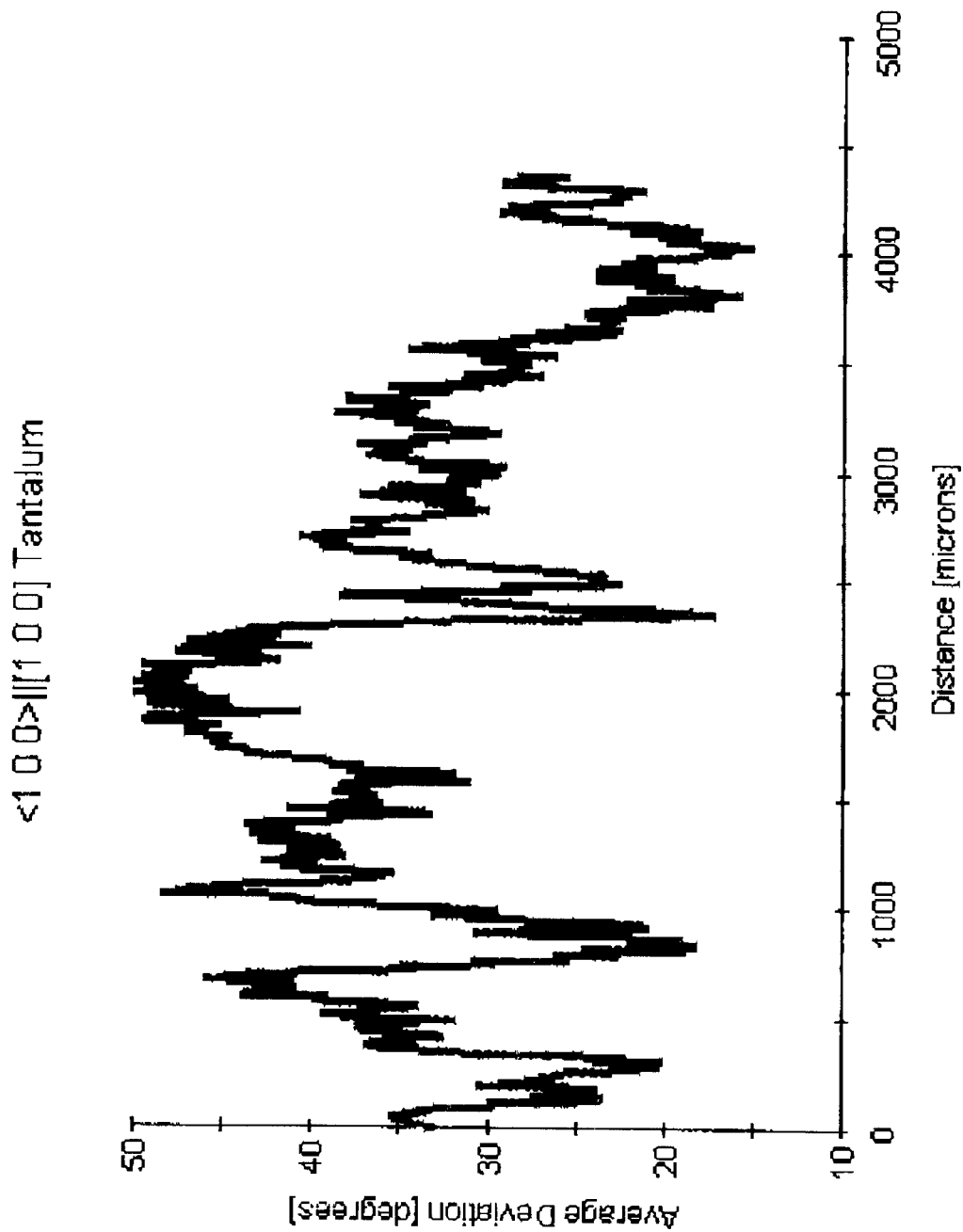
FIG. 9 is a chart providing the average misorientation of each increment versus the thickness of a polycrystalline material provided in FIG. 7.
Figure 10:
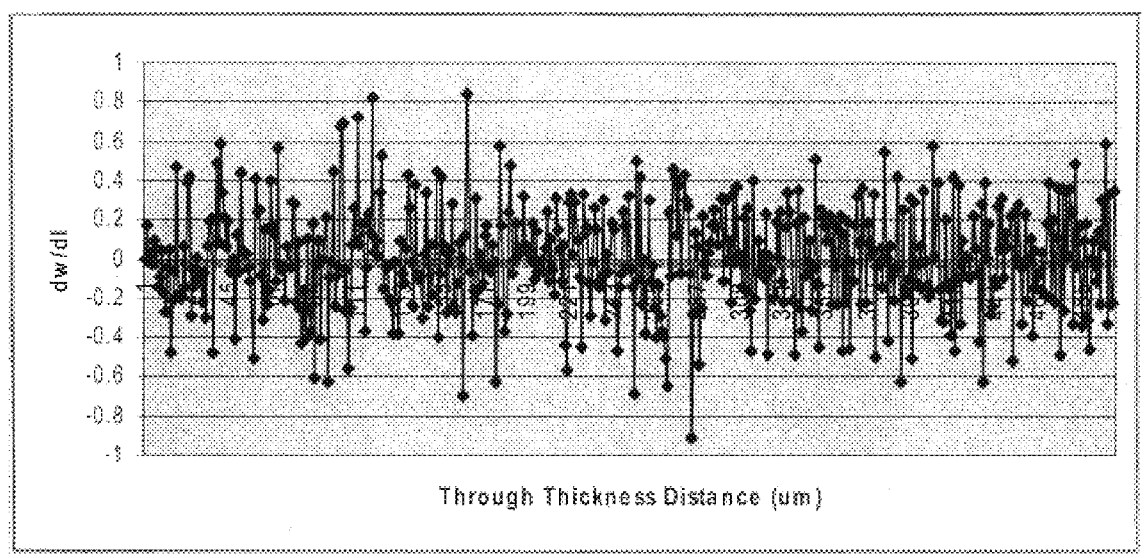
FIG. 10 provides the results of taking the first derivative of the average misorientation of each increment throughout the thickness of a polycrystalline material shown in FIG. 7.
Figure 11:
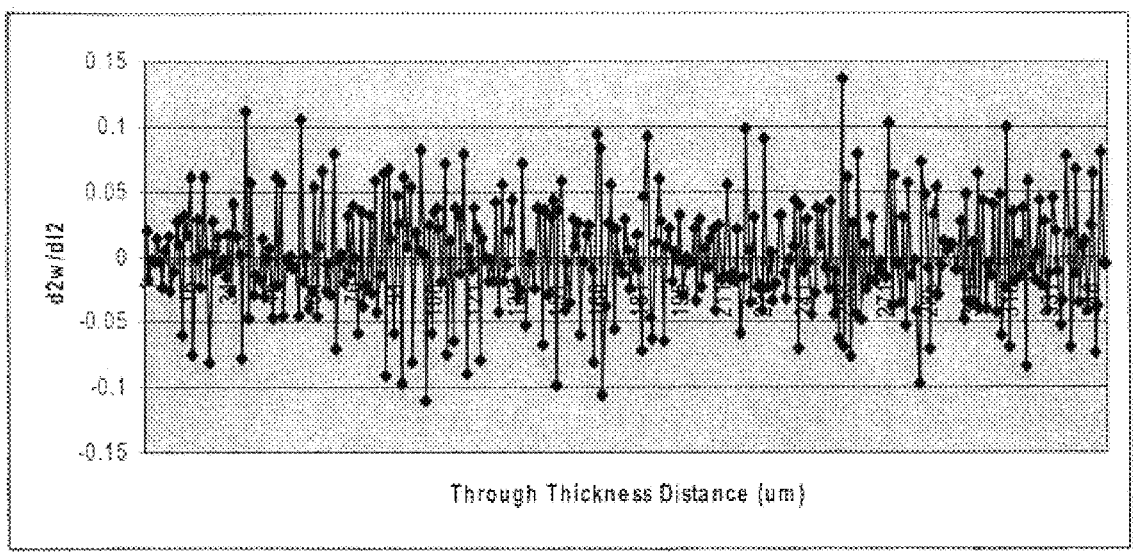
FIG. 11 is a chart of the second derivative function resulting from the average misorientation of each increment of the polycrystalline material shown in FIG. 7.
Figure 1C:
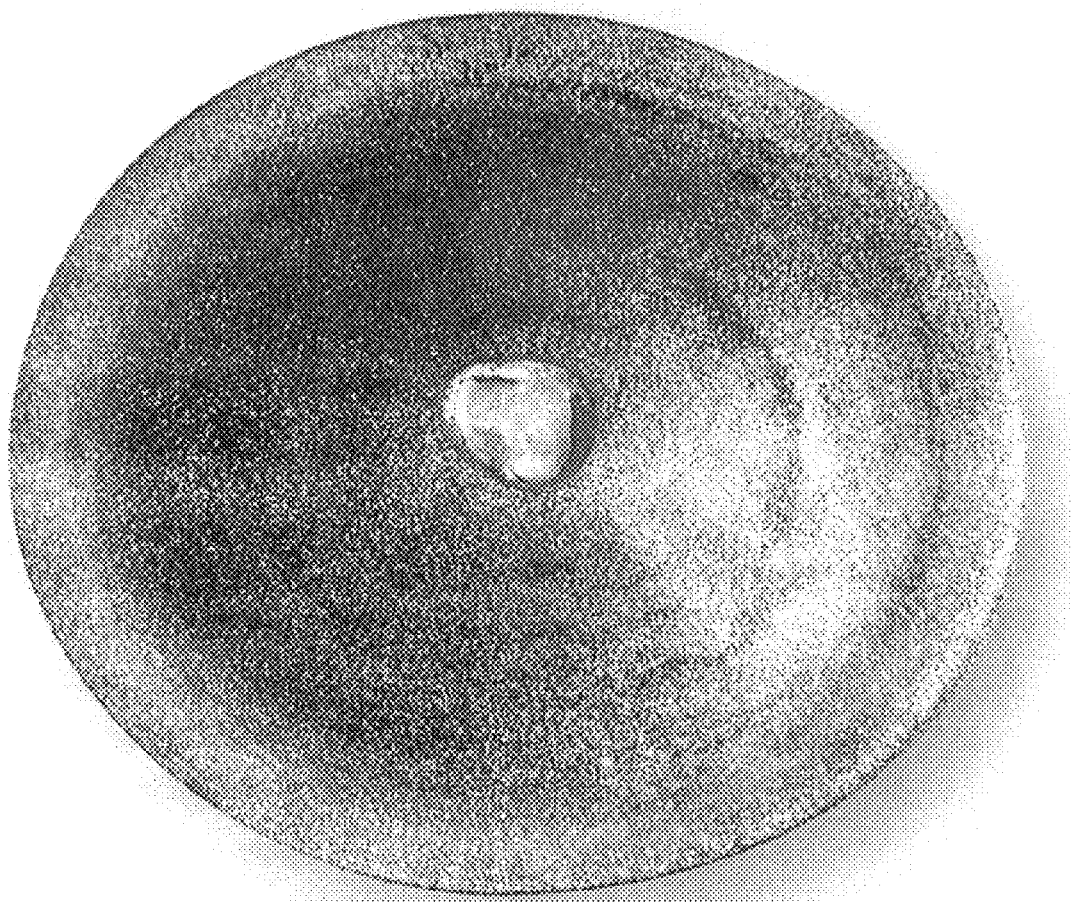
FIG. 1 is a representation of the array of data points measured by orientation imaging microscopy and the definition of variables δ and h within a transverse sample.

A sample was taken along the radial plane of the rejected sputtering target and prepared as in Example 1 and then analyzed by OIM. The normal-orientation inverse pole figure map of the rejected target is shown in FIG. 8. The IPF map reveals the presence of texture bands about the cross section of the target. Plots of the texture function and its first and second derivatives are given in FIGS. 9, 10, and 11, respectively.

Values for the texture gradient parameter and texture banding parameter for the rejected target were $\Omega$=299.980/mm $\Lambda$=61.104/mm Based on this example, it can be concluded that tantalum materials with $\Omega$ and $\Lambda$ values equal to or greater than 299.980/mm and 61.104/mm, respectively, are unsuitable for sputtering target applications.

Example 3

Figure 13:
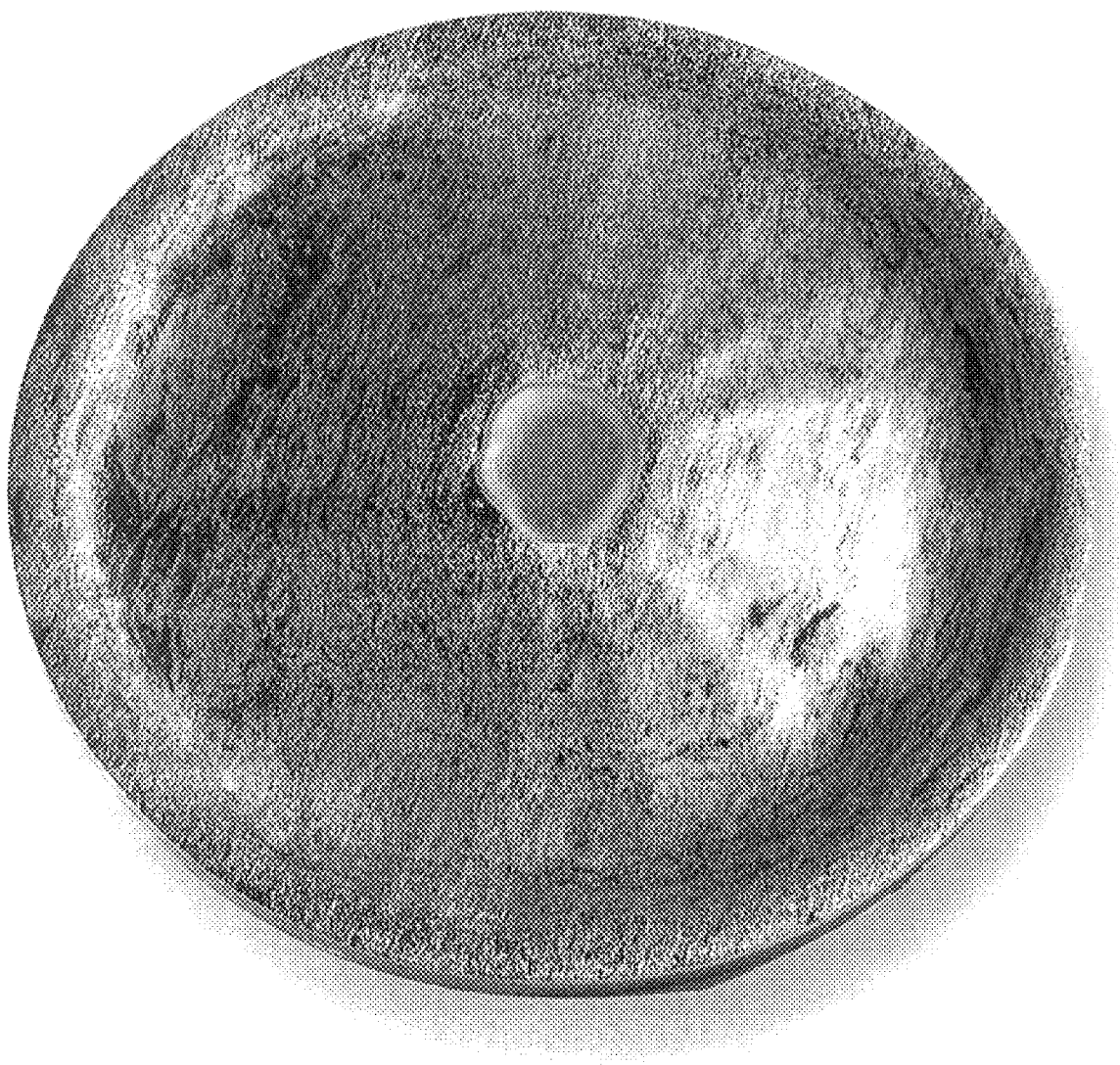
FIG. 13 shows a photograph of a spent tantalum sputtering target deemed to have undesirable sputtering performance.
Figure 14:
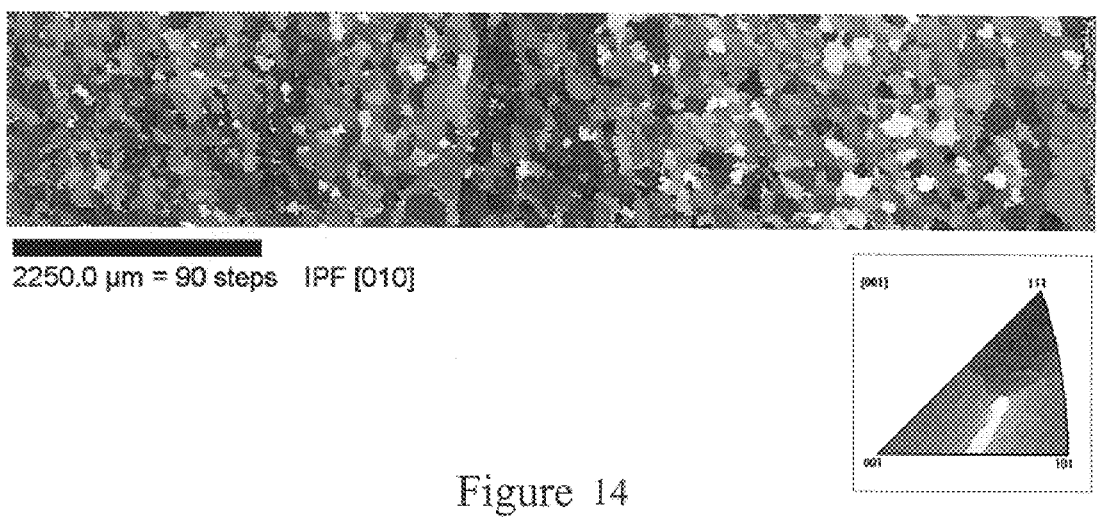
FIG. 14 shows the orientation map of a sample taken from the periphery of the sputtering target shown in FIG. 12.

This example determines values of $\Omega$ and $\Lambda$ for a tantalum sputtering target that exhibited desirable sputtering performance, as well as for a tantalum target that had marginal sputtering performance. Photographs of the desirable and marginal performing sputtering targets are shown in FIGS. 12 and 13, respectively. Normal-orientation IPF maps from transverse sections of the desirable and marginal performing targets are presented in FIGS. 14 and 15, respectively. Samples had been prepared and analyzed using the procedures described in Example 1.

The texture homogeneity parameters of the desirable and marginal performing tantalum targets are reported below:

| Ta Target Performance | $\Omega$ | $\Lambda$ |
| --- | --- | --- |
| Desirable | 74.73/mm | 4.993/mm |
| Marginal | 127.9/mm | 10.313/mm |

Based on the results from Example 2, tantalum material having values of $\Omega$ and $\Lambda$ less than or equal to 74.73/mm and 4.993/mm, respectively, are best suitable for sputtering target applications.

Example 4

This study was conducted to determine the effect of level rolling on the texture homogeneity of tantalum plate. Typical commercial manufacturing of tantalum plate involved cold rolling the plate to finished gauge; the wrought plate was then flattened by being passed through a level roller. After flattening, the tantalum flat product was trimmed and then recrystallized by vacuum annealing.

Level rolling involves passing a plate through a series of offset rollers that bend the plate back and forth as it passes through the mill. Imposing a positive-negative cyclical strain on the plate, any uneven surface stresses in the plate generated during cold rolling are reduced by the Bausinger Effect. The annihilation of dislocations by cyclic loading also reduces the amount of stored work in the material, and hence to driving force for the material to recrystallize with a primary (111) texture. It is possible that the level rolling operation contributes the development of texture gradients in tantalum plate.

For this study, a tantalum plate was transverse rolled from an annealed slab approximately 3.75" thick to a finished gauge of 0.250"; all rolling operations were conducted under ambient conditions. Following finish rolling, a strip approximately 12" long was sheared from the leading edge of the as-cold rolled plate. The balance of the as-rolled rolled plate was flattened by taking 20 passing through a level rolling mill. Next, both the level-rolled plate and the non-level rolled sheared piece were cleaned and annealed in a vacuum of better than $5 \cdot 10^{-5}$ torr at a temperature of 1050° C. for 2 hours. Samples were taken along the sheared edge of each plate, prepared, and analyzed using the procedures described in Example 1. The normal orientation IPF maps of the level rolled and non-level rolled tantalum plate are shown as FIGS. 16 and 17, respectively. The results of the texture homogeneity analysis were

| Ta Plate Process | Ω | Λ |
|---|---|---|
| Level Rolled | 191/mm | 15.2/mm |
| Not Level Rolled | 160/mm | 12.9/mm |

The results from this study confirm that level rolling of as-cold rolled tantalum plate reduced the texture homogeneity of the subsequent annealed product.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A method for quantifying the texture homogeneity of a polycrystalline material comprising:
   selecting a reference pole orientation;
   scanning in increments a cross-section of said material or portion thereof having a thickness with scanning orientation image microscopy to obtain actual pole orientations of a multiplicity of grains in increments throughout said thickness;
   determining orientation differences between said reference pole orientation and actual pole orientations of a multiplicity of grains in said material or portion thereof;
   assigning a value of misorientation from said references pole orientation at each grain measured throughout said thickness;
   determining an average misorientation of each measured increment throughout said thickness; and
   obtaining texture banding by determining a second derivative of said average misorientation of each measured increment through said thickness.

2. The method of claim 1, wherein said polycrystalline material comprises at least one metal.

3. The method of claim 1, wherein said polycrystalline material comprises tantalum.

4. The method of claim 1, wherein said polycrystalline material comprises niobium.

5. The method of claim 1, wherein said polycrystalline material comprises at least one valve metal.

6. The method of claim 1, wherein said polycrystalline material comprises at least one ceramic material.

7. The method of claim 1, wherein said reference pole orientation is (001).

8. The method of claim 1, wherein said scanning orientation imaging microscopy is stage-controlled scanning orientation imaging microscopy.

9. The method of claim 1, wherein said scanning orientation imaging microscopy is beam scanning orientation imaging microscopy.

10. The method of claim 1, further comprising determining a first derivative of said average misorientation of each measured increment through said thickness.

11. A method to predict the sputtering efficiency of a target comprising:
    selecting a reference pole orientation;
    scanning in increments a cross-section of said target or portion thereof having a thickness with scanning orientation imaging microscopy to obtain actual pole orientations of a multiplicity of grains in increments throughout said thickness.
    determining orientation differences between said reference pole orientation and actual pole orientations of a multiplicity of grains in said target or portion thereof;
    assigning a value of misorientation from said reference pole orientation at each grain measured throughout said thickness;
    determining an average misorientation of each measured increment throughout said thickness; and
    obtaining a texture gradient by determining a second derivative of said average misorientation of each measured increment through said thickness.

12. The method of claim 11, wherein said polycrystalline material comprises at least one metal.

13. The method of claim 11, wherein said polycrystalline material comprises tantalum.

14. The method of claim 11, wherein said polycrystalline material comprises niobium.

15. The method of claim 11, wherein said polycrystalline material comprises at least one valve metal.

16. The method of claim 11, wherein said polycrystalline material comprises at least one ceramic material.

17. The method of claim 11, wherein said reference pole orientation is (001).

18. The method of claim 11, wherein said scanning orientation imaging microscopy is stage-controlled scanning orientation imaging microscopy.

19. The method of claim 11, wherein said scanning orientation imaging microscopy is bean scanning orientation imaging microscopy.

20. The method of claim 11, further comprising determining a first derivative of said average misorientation of each measured increment through said thickness.

21. A system for quantifying the texture homogeneity of a polycrystalline material comprising:
    a scanning orientation imaging microscope;
    means for determining orientation differences between a reference pole orientation and actual pole orientations of a multiplicity of grains in said material;
    means for assigning a value of misorientation from said reference pole orientation at each grain measured throughout said thickness;
    means for determining an average misorientation of each measured increment throughout said thickness; and
    means for obtaining a second derivative of said average misorientation of each measured increment through said thickness.

22. The system of claim 21, further comprising means for determining a first derivative of said misorientation of each measured increment through said thickness.

23. The system of claim 21, wherein said microscope is equipped with a low-light camera to capture Kikuchi patterns generated when individual grains are irradiated by an electron beam from the microscope.

24. A system for quantifying the texture homogeneity of a polycrystalline material comprising:
    means for obtaining actual pole orientations of said polycrystalline material;
    means for determining orientation differences between a reference pole orientation and actual pole orientations of a multiplicity of grains in said material;
    means for assigning a value of misorientation from said reference pole orientation at each grain measured throughout said thickness;
    means for determining an average misorientation of each measured increment throughout said thickness; and means for obtaining a second derivative of said average misorientation of each measured increment through said thickness.

25. The system of claim 24, further comprising means for determining a first derivative of said misorientation of each measured increment through said thickness.

26. The system of claim 24, wherein said means for obtaining actual pole orientations is with x-ray microdiffraction.

27. A method to predict the sputtering efficiency of a target comprising:

selecting a reference pole orientation;

scanning in increments a cross-section of said target or portion thereof having a thickness with a device capable of obtaining actual pole orientations of a multiplicity of grains in increments throughout said thickness.

determining orientation differences between said reference pole orientation and actual pole orientations of a multiplicity of grains in said target or portion thereof;

assigning a value of misorientation from said reference pole orientation at each grain measured throughout said thickness;

determining an average misorientation of each measured increment throughout said thickness; and obtaining a texture gradient by determining a second derivative of said average misorientation of each measured increment through said thickness.

* * * * *